(12) United States Patent
Krawzak et al.

(10) Patent No.: US 6,245,250 B1
(45) Date of Patent: Jun. 12, 2001

(54) PROCESS VESSEL

(75) Inventors: Tom Krawzak; Victor Mimken, both of Boise; Rod Fladwood, Nampa; Wyland Atkins, Kuna, all of ID (US)

(73) Assignee: SCP Global Technologies Inc., Boise, ID (US)

( * ) Notice: Subject to any disclaimer, the term of this patent is extended or adjusted under 35 U.S.C. 154(b) by 0 days.

(21) Appl. No.: 09/262,991

(22) Filed: Mar. 5, 1999

(51) Int. Cl.$^7$ .................................................. C23G 1/02
(52) U.S. Cl. ........................ 216/83; 134/2; 134/3; 134/34; 134/902; 216/99; 216/96; 216/13; 216/47; 216/90; 438/745; 438/753
(58) Field of Search .............................. 134/2, 3, 34, 902; 216/83, 99, 96, 13, 90, 47; 438/745, 753

(56) References Cited

U.S. PATENT DOCUMENTS

| | | | |
|---|---|---|---|
| 4,633,893 | * | 1/1987 | McConnell et al. .................... 134/95 |
| 4,753,258 | * | 6/1988 | Seiichiro ............................... 134/186 |
| 5,948,173 | * | 9/1999 | Huh et al. .............................. 134/34 |

* cited by examiner

*Primary Examiner*—Sharidan Carrillo
(74) *Attorney, Agent, or Firm*—Stallman & Pollock LLP

(57) ABSTRACT

A process vessel which may be utilized in wet processing of semiconductor wafers includes a tank having one or more fluid displacers attachable to the tank. The one or more fluid displacer(s) have position in which they extend into the interior of the tank. The fluid displacers may be carried by a lid moveable into a closed position covering the opening in the tank. Movement of the lid into the closed position causes the fluid displacers to extend into the tank.

10 Claims, 12 Drawing Sheets

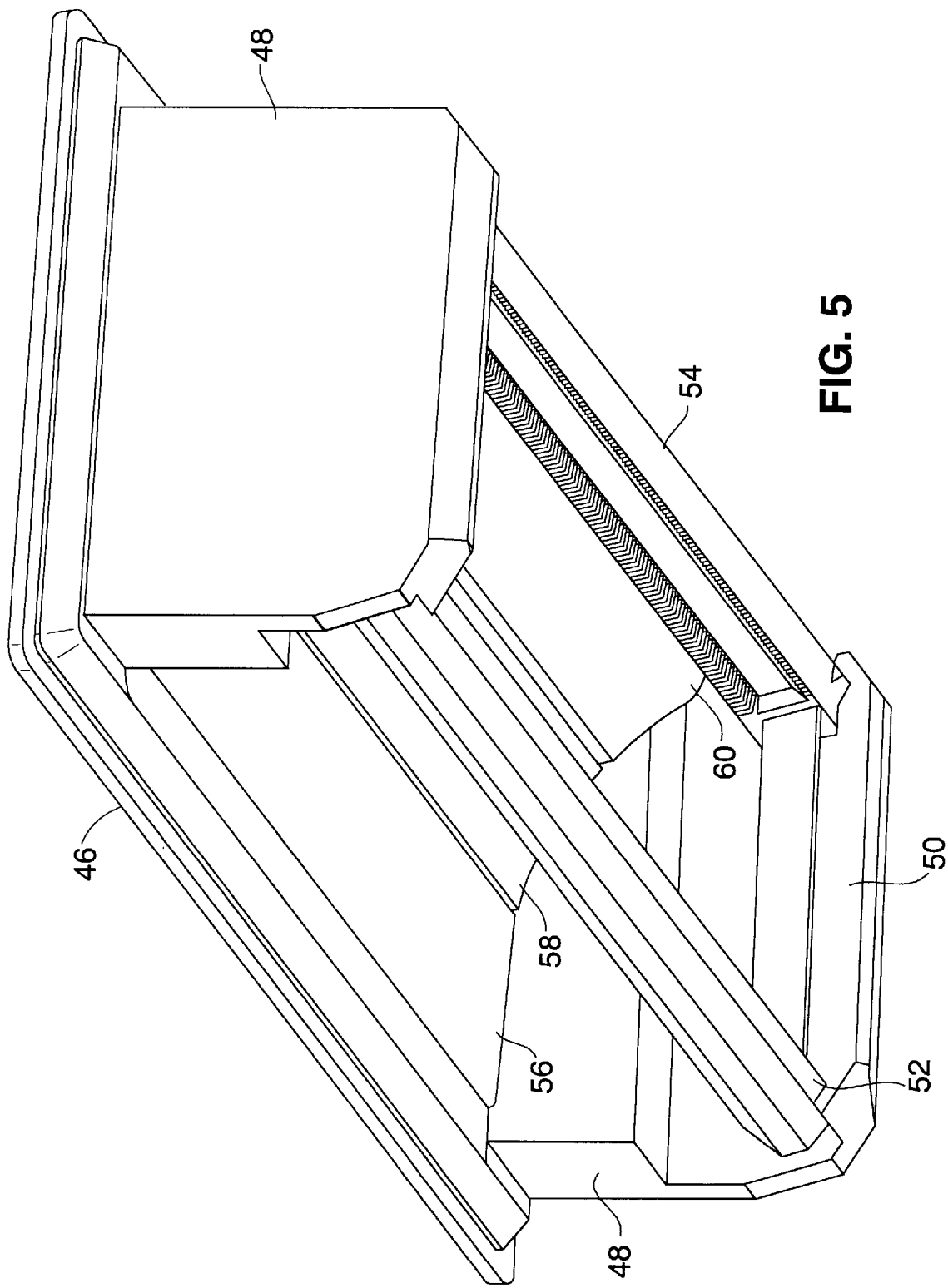

PROCESS VESSEL

FIELD OF THE INVENTION

The present invention relates generally to apparatuses and methods for treating and cleaning objects using liquids. More particularly, the present invention relates to vessels in which objects are treated and/or cleaned using chemicals and/or water.

BACKGROUND OF THE INVENTION

Numerous products in the high tech area include generally planar components that must be subjected to a number of sequential wet processing steps. Examples of objects processed in this manner include flat panel displays, optical and magnetic recording disks, photomasks, and silicon wafers from which semiconductor chips are fabricated. For the sake of simplicity, the present invention is discussed below with reference to the manufacture of semiconductor devices from silicon wafers. However, this is not intended to limit in any way the scope of applications to which the cassette of the present invention may be applied.

Surface processing of silicon wafers to make semiconductor devices such as integrated circuits involves a number of stages in which wafers are placed in process vessels and exposed to various fluids, such as hydrochloric acid, hydrofluoric acid, sulfuric acid, and deionized water ("DI"), a common rinse fluid. During cleaning applications in which the wafers are immersed in a cleaning solution, megasonic energy may be directed towards the wafers using one or more megasonic transducers. The resulting agitation of the cleaning solution is sufficiently powerful to remove particles from the surfaces of the wafers.

It is highly desirable to carry out such wet processing steps in vessels that promote uniform fluid flow and megasonic energy flow over the wafer surfaces, because uniform flow correlates to more uniform characteristics across the surfaces of the wafers. For environmental and cost reasons, it is further desirable to minimize the volumes of process chemicals that are consumed during processing. Also important is to minimize the amount of space the vessels and related plumbing consume within the foundry while optimizing the number of wafers that can be treated within each vessel at a given time. Doing so allows the number of wet processing stations within a given foundry to be maximized and thus increases the overall yield of the facility.

SUMMARY

In one aspect of the process vessel, a tank is provided together with one or more fluid displacers attachable to the tank. The one or more fluid displacer(s) have position in which they extend into the interior of the tank. In another aspect of the process vessel, the fluid displacers are carried by a lid moveable into a closed position covering the opening in the tank. Movement of the lid into the closed position causes the fluid displacers to extend into the tank. These and various other novel aspects of the process vessel described herein are described in detail below.

BRIEF DESCRIPTION OF THE DRAWINGS

FIG. 5 is a perspective view of the lid of the process vessel of FIG. 1, showing a wafer cassette supported by the lid;

DETAILED DESCRIPTION OF THE DRAWINGS

The process vessel and method of use according to the present invention will be described in the context of surface preparation for semiconductor wafer substrates. This is done for purposes of illustration only and is not intended in a limiting sense. The system and method of the present invention are equally suitable for use in chemically treating and/or rinsing other objects for which uniform fluid flow is desirable. Examples of such other objects include, but are not limited to flat panel displays, optical and magnetic recording disks, and photomasks.

Structure

Figure 1:
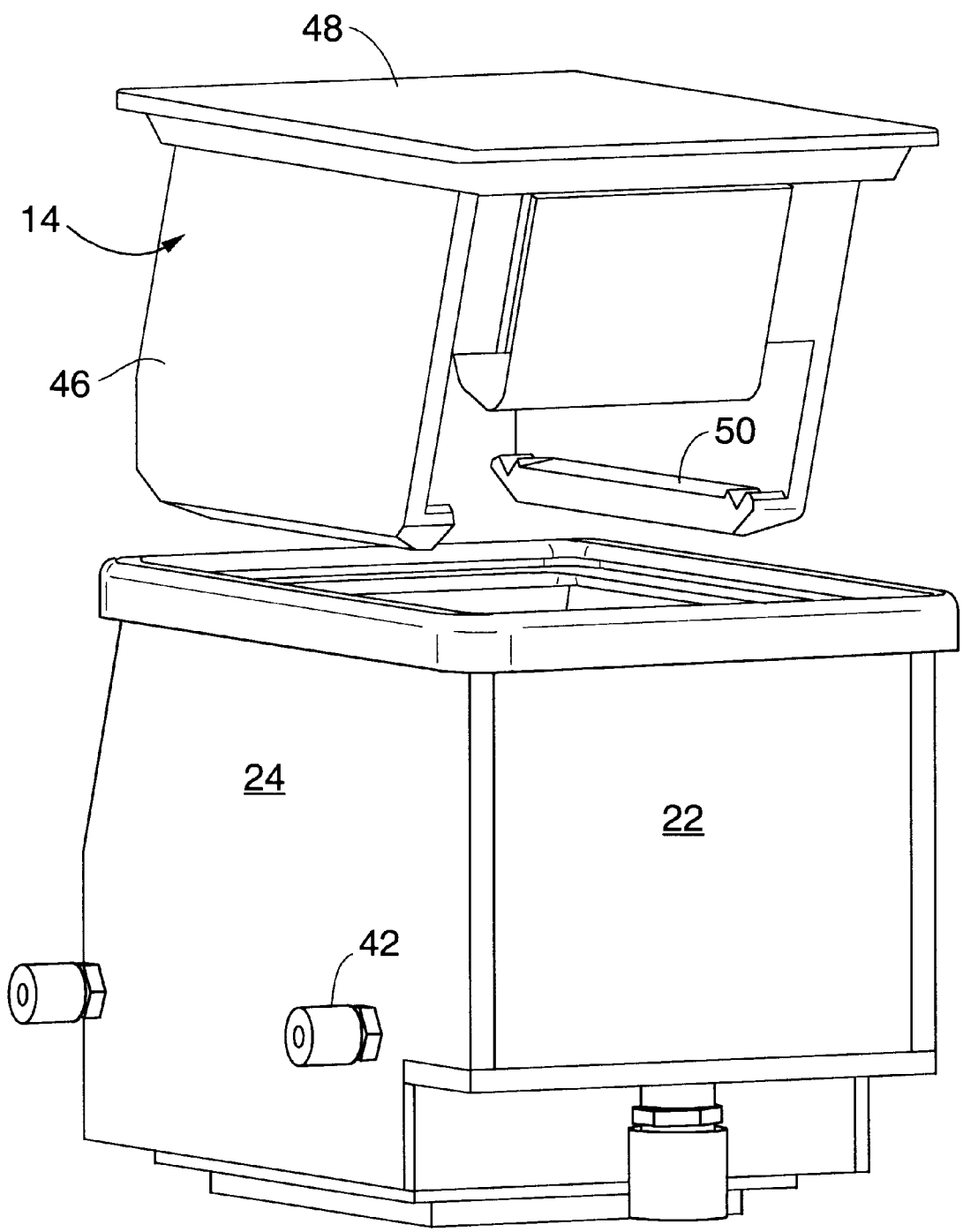
FIG. 1 is a perspective view of an embodiment of a process vessel utilizing principles according to the present invention, showing the lid elevated above the vessel.
Figure 2:
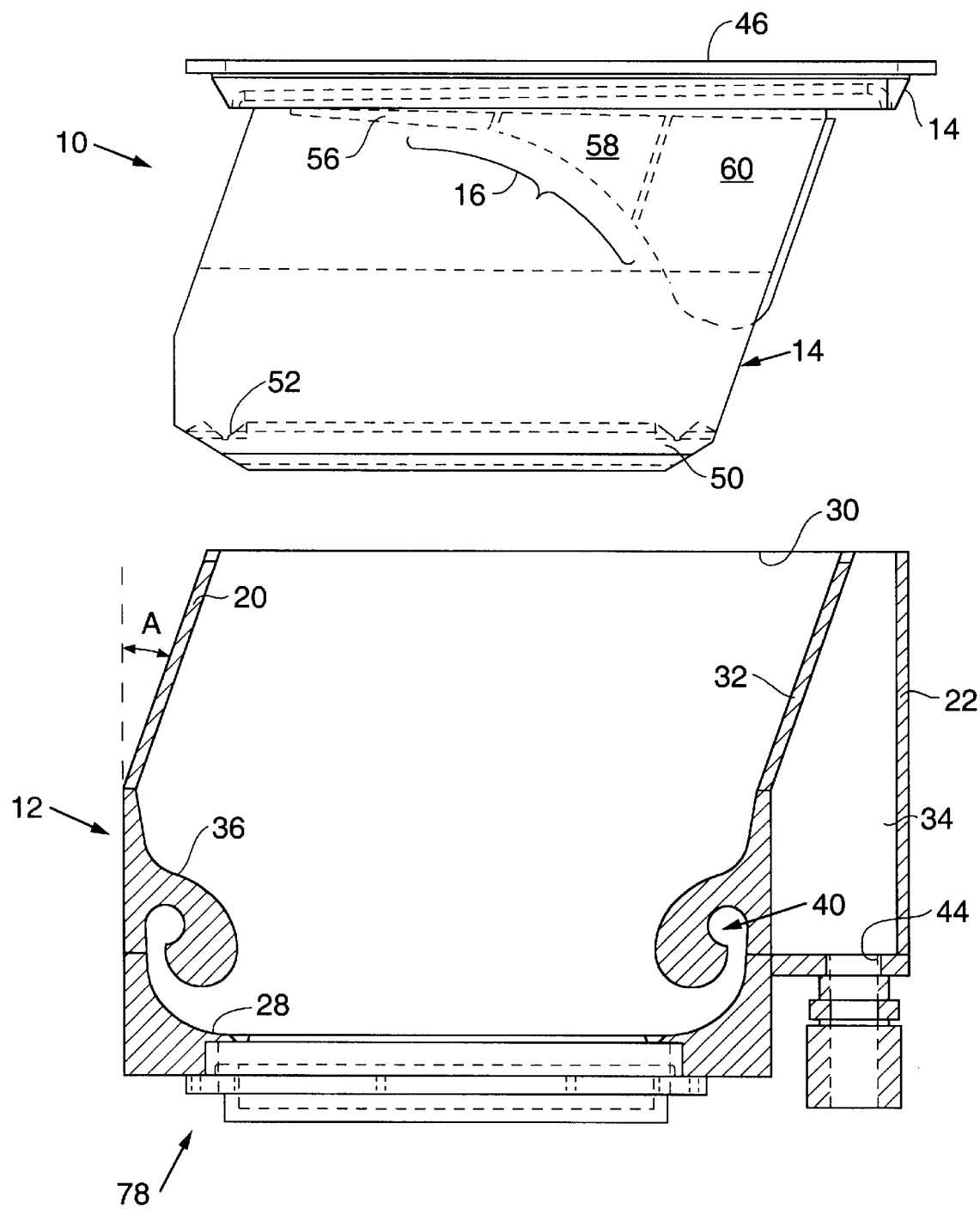
FIG. 2 is a front elevation view of the process vessel of FIG. 1, showing the lid elevated above the vessel and further showing the vessel in cross-section.
Figure 3:
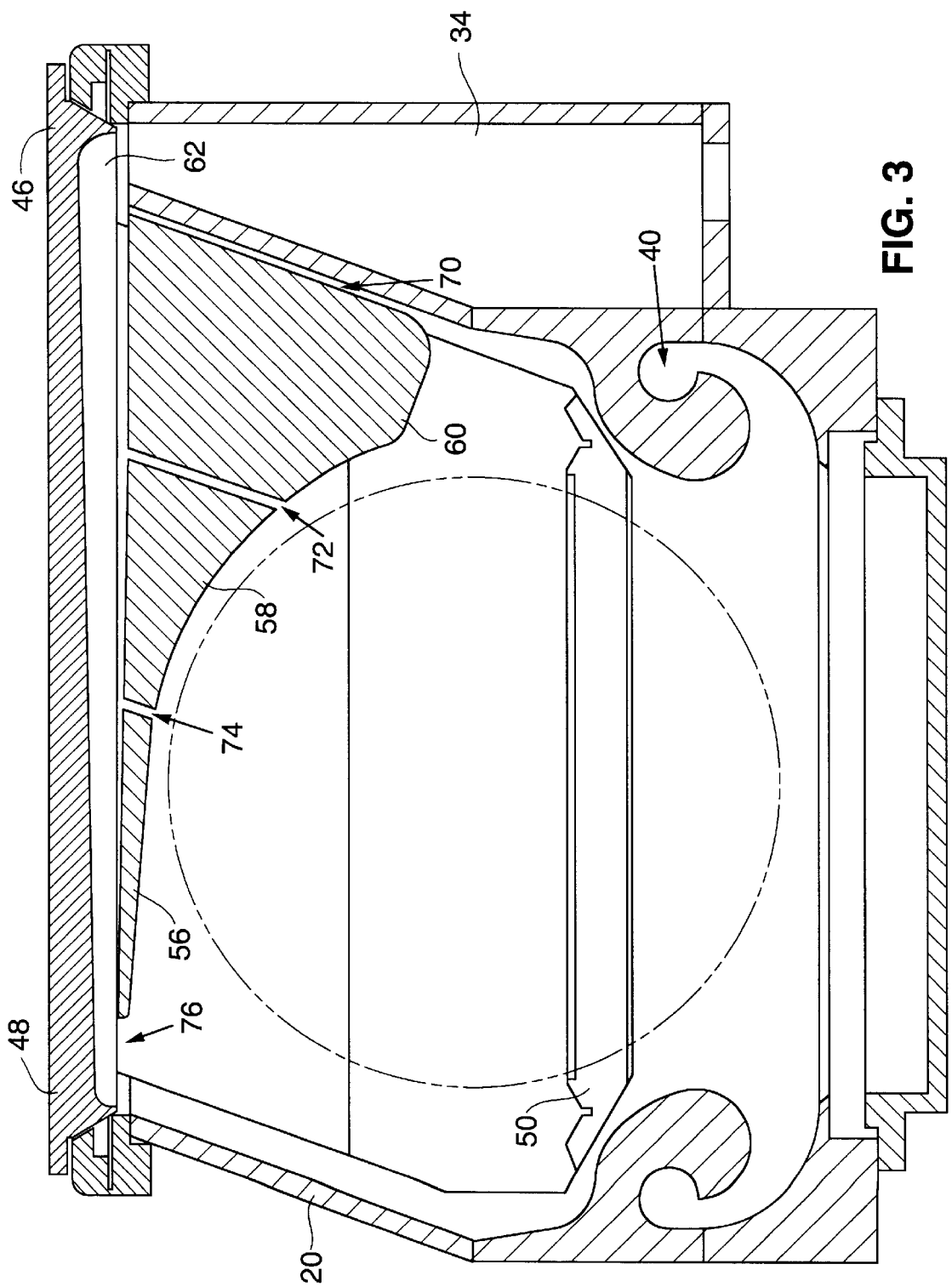
FIG. 3 is a cross-sectional front elevation view of the process vessel of FIG. 1 showing the lid in place on top of the vessel and further illustrating a wafer positioned in the vessel. For clarity, the wafer cassette is not shown.
Figure 4:
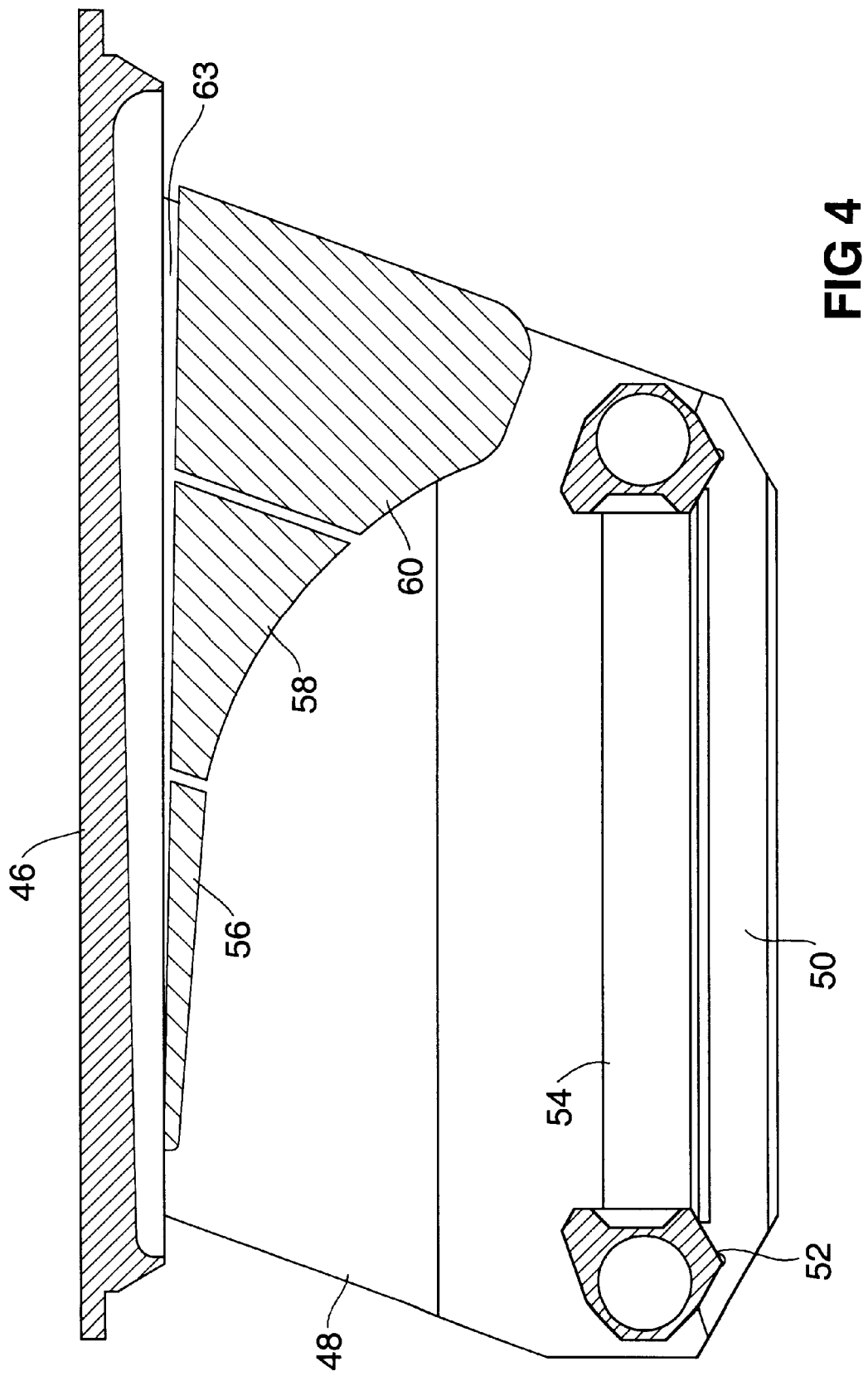
FIG. 4 is a cross-sectional front elevation view of the lid of the process vessel of FIG. 1.

A first embodiment of a process vessel 10 in accordance with the present invention is illustrated in FIGS. 1 through 5. Referring to FIGS. 1 and 2, the first embodiment generally comprises a tank 12, a lid 14, and fluid displacers (labeled generally as 16 in FIG. 2) carried by lid 14. During use, the lid is placed on top of the tank, causing the fluid displacers to be suspended within the tank as illustrated in FIG. 3. This aspect of the vessel will be more fully described in the detailed description of lid 14.

Details of tank 12 will next be described with reference primarily to FIGS. 1–3. Referring to the cross-section view of FIG. 2, tank 12 includes side walls 20, 22, end walls 24 (FIG. 1 shows one, the opposite one is not shown) and a tank bottom 28 that together form a container having an opening 30 on top. An interior wall 32 divides the tank into a main section sized to receive wafers for processing, and an overflow weir 34 which receives process fluids that cascade over interior wall 32.

The tank walls are designed to assist in the optimization of fluid flow within the vessel. Widely varying shapes and contours (including straight and flat walls) may be used to this end without departing from the scope of the present invention. In one embodiment the walls 20, 32 include angled upper sections that are preferably parallel to one another. The specific angle at which these wall sections are oriented is not critical, although larger angles lead to increased conservation of process fluids. In one embodiment, an angle A of approximately 20° from the vertical axis was chosen for purposes of packaging. Even greater angles, e.g. 45°, may be utilized to further reduce the amount of chemical needed for processing in the vessel.

It has also been found preferable (albeit not required) to form the interior surfaces of walls 20, 32 to have contoured lower sections similar to those shown in FIG. 2. A preferred contour includes a curled region 36 having an initial curve towards the interior of the vessel, followed by an outward curve away from the vessel interior. The curvature of these walls forms a pair of horn regions 38 in the vessel interior. The endmost areas of these horn regions 38 form tube-like folds 40 extending between the end walls 24 of the vessel. Fluid inlets 42 are formed in end walls 24 and are in fluid communication with folds 40. Inlets 42 include external fixtures as shown in FIG. 1 that connect them to a source of processing fluids via external plumbing (not shown). During use, processing fluids are pumped into tank 12 via the inlets and travel into folds 40 and then over the surfaces of the wafers as described in greater detail in the Operation section. Although more conventional slotted diffusers or manifolds may be used for delivering fluids from the inlets into the vessel, folds 40 are beneficial in that they minimize particle entrapment and local fluid turbulence within the vessel.

A dump door 41 is formed in the tank for quickly removing fluids from the tank when needed. If the vessel is to be used for megasonic applications, megasonic transducer 78 may be mounted to the vessel bottom using a mounting plate 79 and positioned to deliver megasonic energy through the tank bottom 28. The flat tank bottom 28 of the preferred embodiment is particularly advantageous is that it allows a single flat transducer array to be used, rather than some of the more complex transducer arrangements required by prior art tank designs.

Interior wall 32 forms a partition between the main processing section of the tank and overflow weir 34. During use, process fluids cascade over this partition and into weir 34. Weir 34 includes a drain 44, through which overflow chemicals flow for recirculation or disposal. The height of interior wall 32 is not critical, although an overflow level above the level at which the tops of the wafers will be located within the tank is desirable for a number of reasons. For rinse applications, this relatively high overflow level allows a full volume of rinse fluid to be maintained within the tank. This is desirable so that, in the event of a fabrication facility shut down, a batch of wafers may be fully immersed in a rinse tank to protect them until such time as processing may continue.

A higher overflow level is also desirable for vessels used for chemical process steps. Oftentimes a chemical crust will form along the walls of a process vessel at the overflow line. Flowing chemical can slough off portions of the crust, releasing particles into the flow. By keeping the overflow level above the wafer level, any crust formation will occur above the wafer level, and any crust that enters the flowing chemical will flow over the tops of the wafers into the weir. This minimizes the potential that the crust will contact and potentially damage the wafers.

The process vessel includes a lid 14 that serves multiple functions. First, the lid serves as a cover sealing tank 12 and thus minimizes passage of fumes from the tank into the surrounding environment as well as migration of airborne particles into the vessel. Second, lid 14 supports a wafer cassette and holds the cassette and wafers suspended in tank 12 when it is positioned over tank opening 30. Finally, lid 14 includes features that help to minimize the tank's volume and that resultantly minimize the volumes of process fluids needed to bathe the wafers. These features will next be described.

Figure 11:
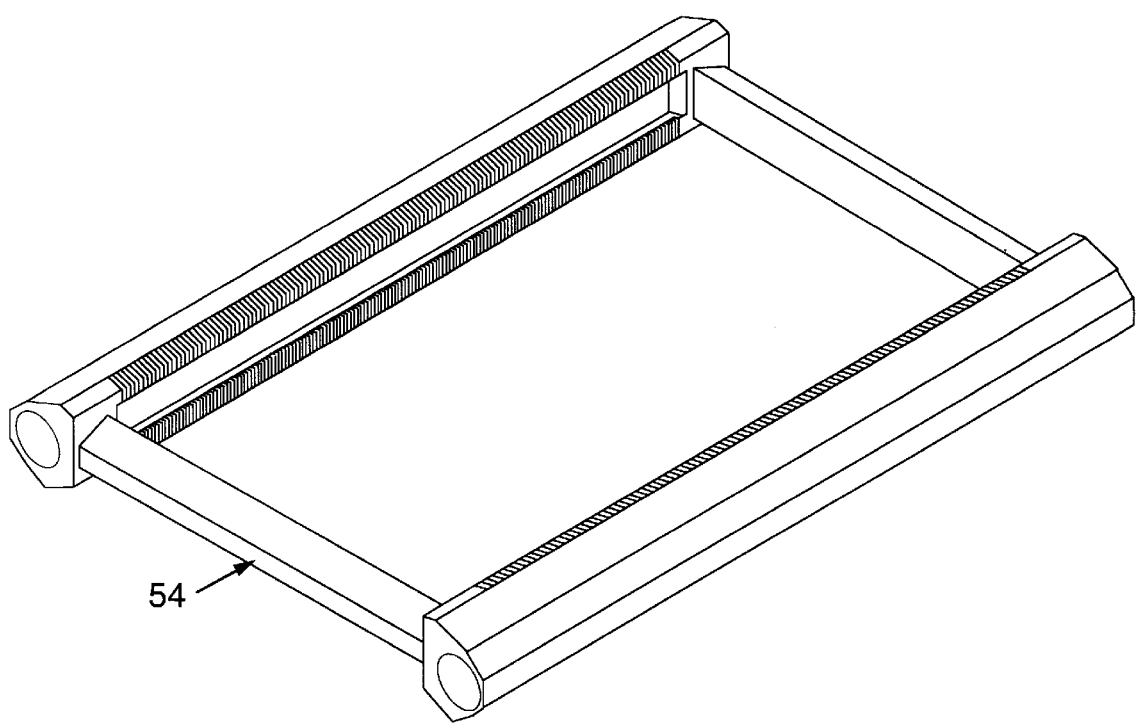
FIG. 11 is a perspective view of a cassette of a type that may be used in connection with the vessels described herein in contexts where the vessel is to be used for processing semiconductor wafers.

Referring to FIG. 5, lid 14 includes a top plate 46 and a pair of side panels 48 extending downwardly from top plate 46. Each side panel includes a support member 50 having notches 52 used to engage corresponding notches on a wafer cassette, which may be similar to the cassette 54 or which might be a more conventional type of cassette. Cassette 54 is beneficial for use with this process in that it occupies relatively little space within the tank and in that it does not have structures positioned beneath the wafer that would obstruct fluid flow or propagation of megasonic energy. Details of cassette 54 are disclosed in co-pending patent application entitled PROCESS CASSETTE, Mimken et al, filed Mar. 5, 1999 (based on Provisional Application No. 60/103,693), which is incorporated herein by reference. A perspective view of cassette 54 is shown in FIG. 11.

Referring again to FIG. 3, fluid displacers 56, 58, 60 are mounted to top plate 46 and extend into the tank when the tank is covered by lid 14. The shapes of the displacers are selected to optimize fluid flow within the tank while minimizing the interior volume of the tank. One desirable configuration for the displacers is the one shown in the drawings, in which three displacers are shaped to approximately conform to a portion of the wafer edges. Displacers 56, 58, 60 include angular sidewalls which preferably are angled at close to or the same angle as tank walls 20, 32. Flow channels 70, 72, 74, 76 are formed between each of the displacers, as well as between the displacers and adjacent walls 20, 32. A channel 62 formed in top plate 46 allows fluid flowing between the displacers to continue over the tops of the displacers and into overflow weir 34. Channel 62 is preferably angled from the horizontal as shown to prevent bubbles from becoming trapped within it during use of the vessel. Adjacent channels 63 (FIG. 4) are formed along the top faces of the displacers, and are angled downwardly towards the overflow wall 32 to promote fluid runoff.

For use in surface preparation processes for semiconductor wafers, the process vessel must be formed of materials capable of withstanding the high temperatures and harsh chemicals that are needed for treating the wafers. For many applications, the vessel may be formed of PFA (perfluoroalkoxy) Teflon® brand material (hereinafter referred to for simplicity as PFA). PFA is a material preferred for ultra clean applications such as the fabrication of semiconductors because it exhibits high resistance to a broad variety of chemicals, and is not readily contaminated by other materials. For applications involving high temperatures, an alternative material such as quartz may be used, since the modulus of elasticity of PFA decreases with high temperatures. PFA may also be used for high temperature vessels if reinforced with a suitable material.

Figure 6A:
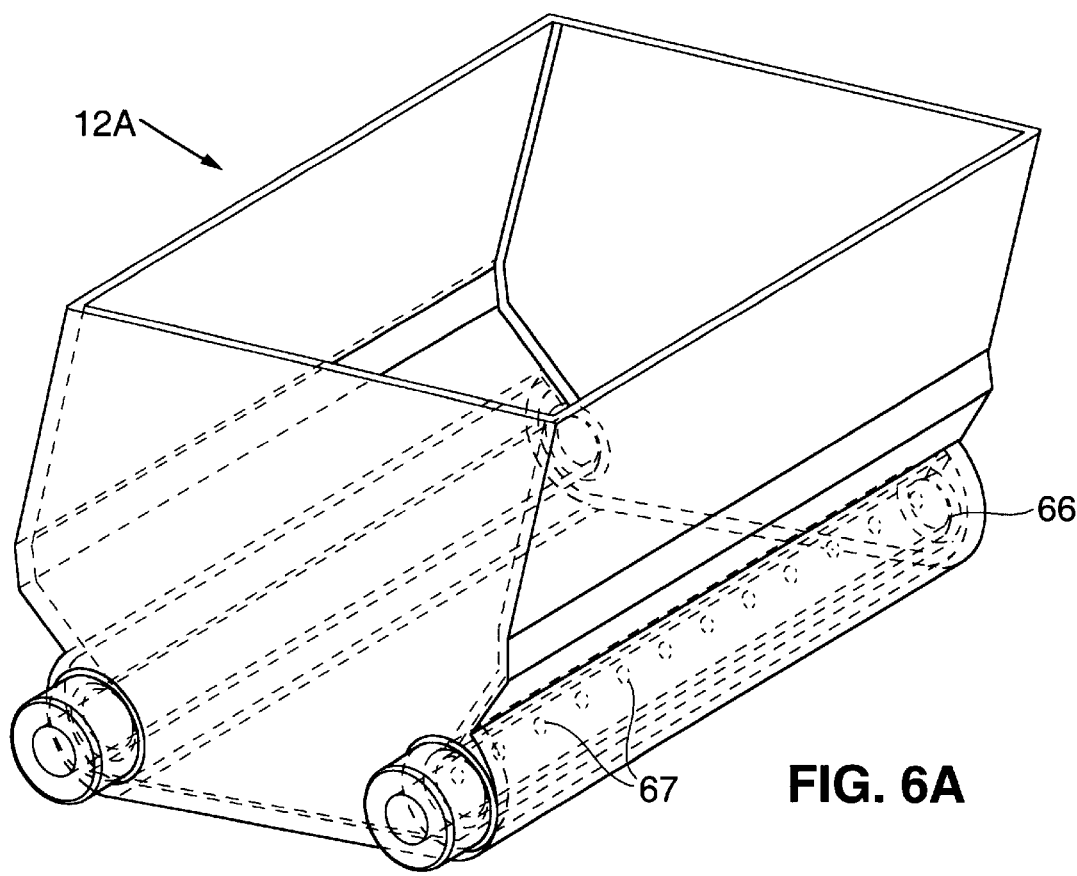
FIGS. 6A and 6B are a perspective view and a cross-sectional front elevation view of a second embodiment of a process vessel utilizing principles of the present invention.
Figure 6B:
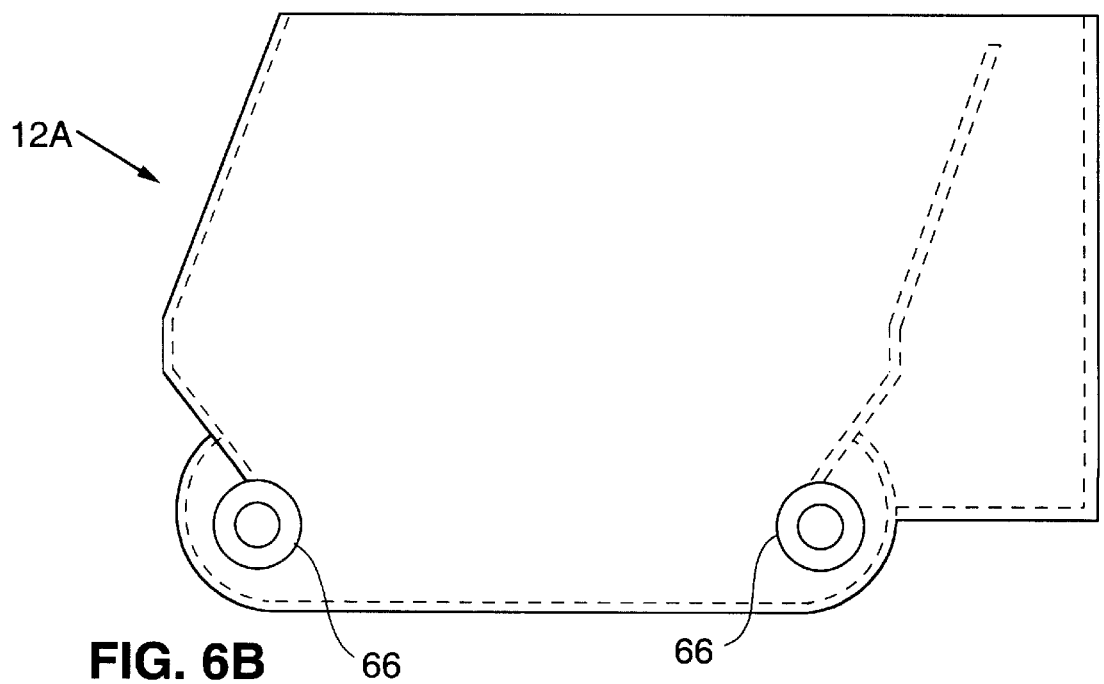
Figure 7A:
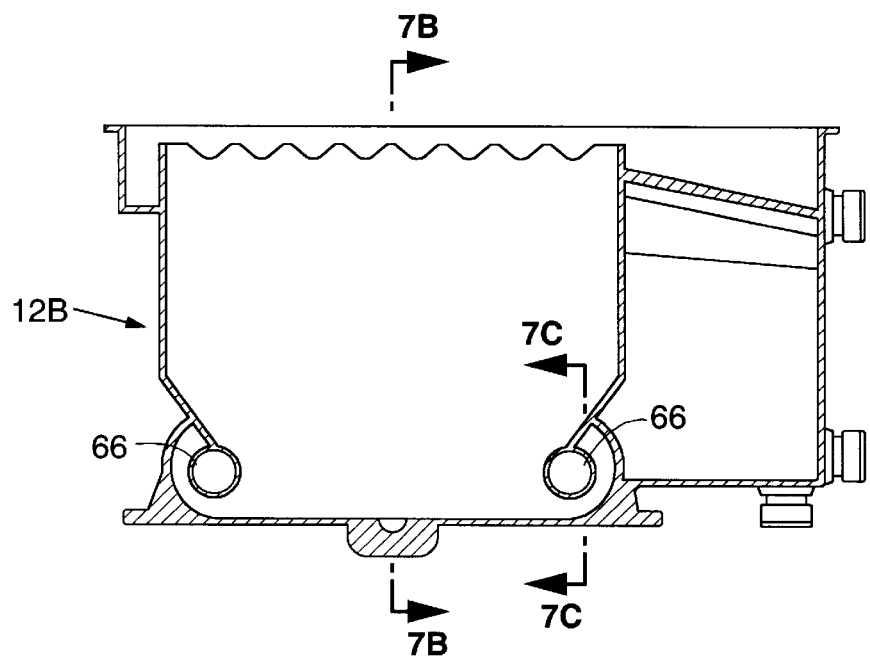
FIG. 7A is a cross-sectional front elevation view of a third embodiment of a process vessel utilizing principles of the present invention.
Figure 7B:
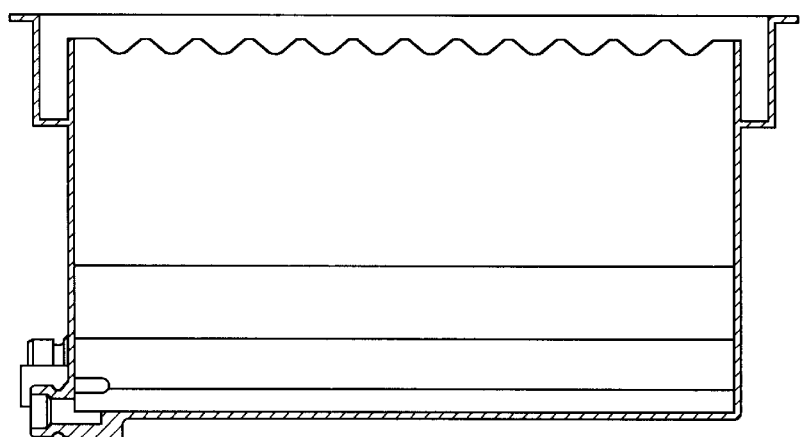
FIGS. 7B and 7C are cross-section views of the process vessel of FIG. 7A, taken along the planes designated 7B—7B and 7C—7C, respectively.
Figure 7C:
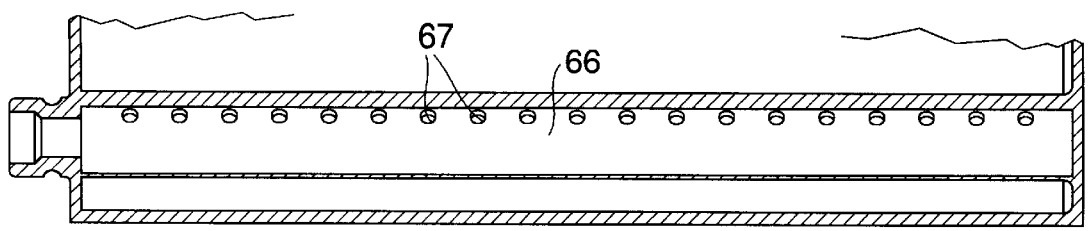
Figure 7D:
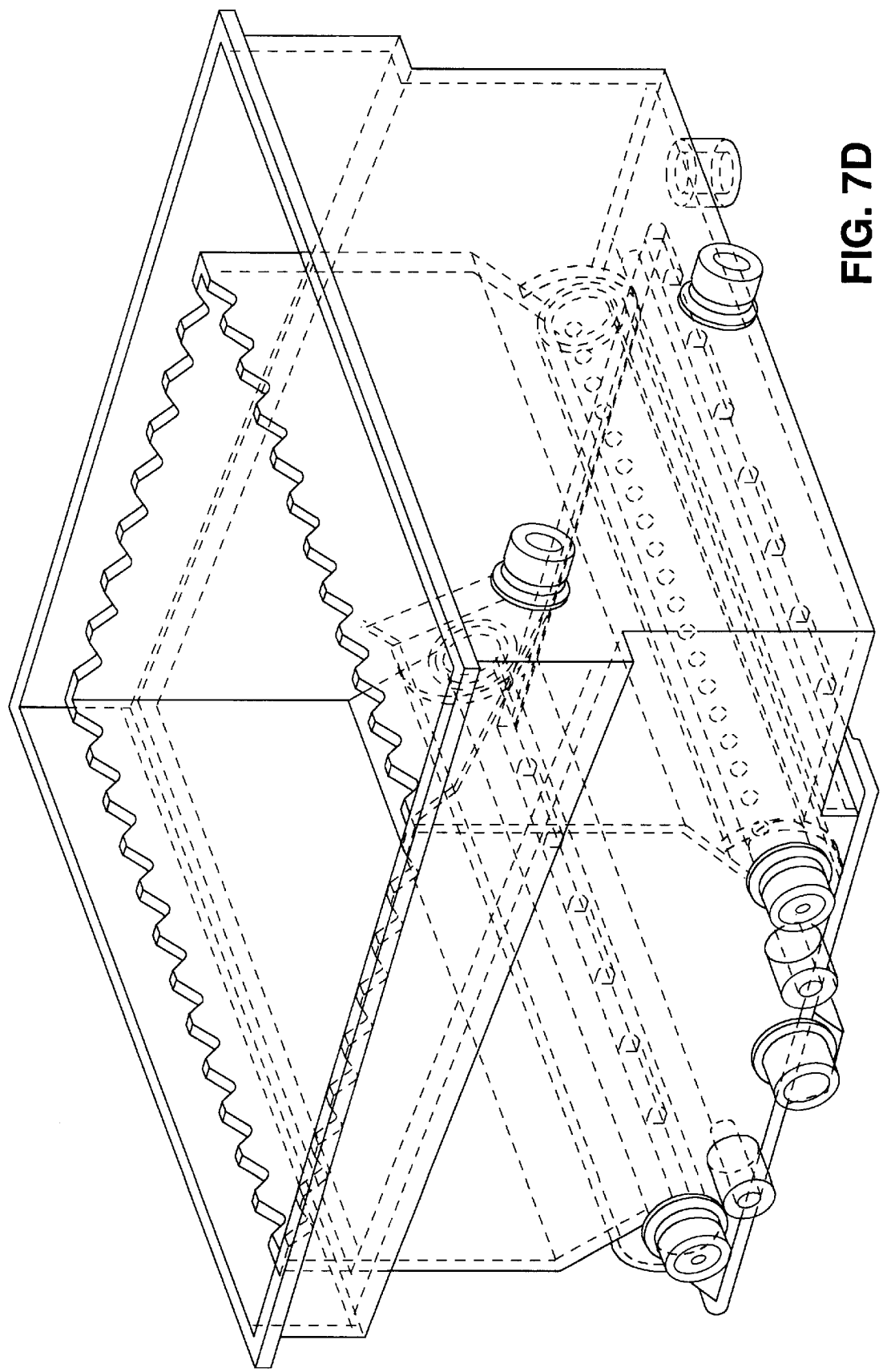
FIG. 7D is a perspective view of the process vessel of FIG. 7A.

Manufacturing limitations may render it difficult to configure a quartz tank to have the cross-sectional shape of the first embodiment. A quartz tank 12a may thus be formed to have the shape shown in FIGS. 6A and 6B, in which the tube-like structures 40a may be formed using quartz tubes 66 fused to quartz plates. A plurality of spaced apart holes 67 extend longitudinally along the tubes to direct fluid into the curled regions of the vessel as indicated by arrows in FIG. 6A.

As discussed, the vessel make be formed in one of many shapes. An alternative embodiment utilizing a different shape having vertical walls as shown in FIGS. 7A–7D. It should be appreciated that if this embodiment is used with a lid having fluid displacers, the orientation of the displaces will differ slightly from what is shown in FIG. 3 so as to be compatible with the vertical walls. The embodiment shown in FIGS. 7A–7D utilizes a manifolding arrangement that includes tubes 66 similar to those used in the embodiment if FIGS. 6A and 6B, but may alternatively be provided without the tubes and with a structure similar to that of the embodiment of FIG. 1.

Operation

General operation and use of the process vessel of the type shown in the drawings will next be described. Typically, tank 12 is filled with process fluids before wafers are transferred into it. The wafers are placed in cassette 54, and support members 50 on the lid 14 (see FIG. 5) engage cassette 54. Lid 14 is lowered onto tank 12 and seated against the upper rim of the tank, thereby sealing the tank and causing the cassette and wafers to be suspended within it. As discussed, some of the fluids in the tank may cascade over interior wall 32 as the wafers are lowered into the tank.

Figure 8:
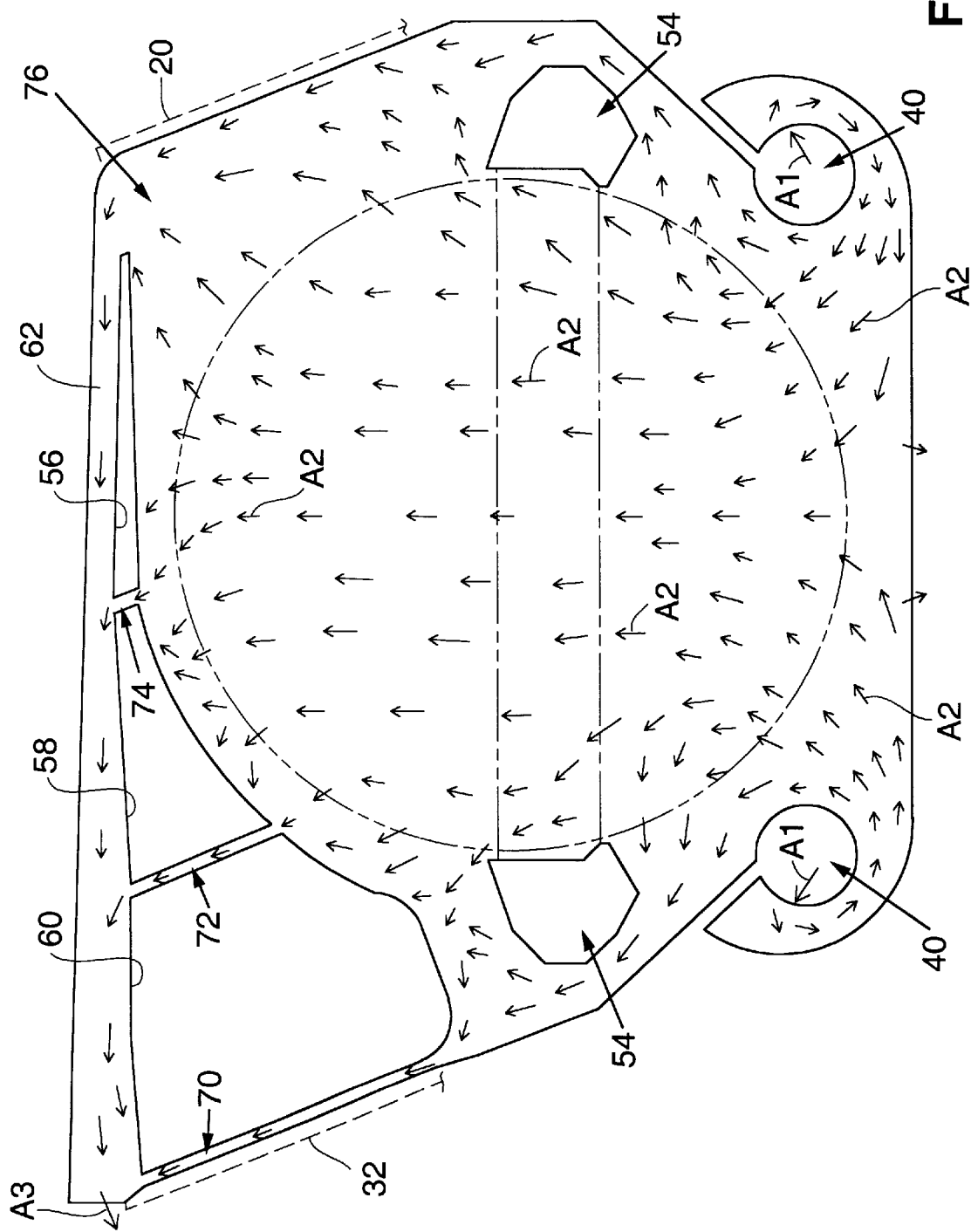
FIG. 8 schematically illustrates fluid flow within a process vessel and across the wafer surface utilizing principles of the present invention.

Next, process fluids are pumped into folds 40 via inlets 42. Movement of fluids through the tank and across a wafer's surface is illustrated in FIG. 8. Dark regions represent areas in which fluid is flowing. Light regions represent structure of tank 12, lid 14, or cassette 54. From this drawing it can be appreciated that the displacers 56, 58, 60 occupy a substantial volume within the tank, thereby reducing the amount of fluids needed to fill the tank. Including the fluid displacers on lid 14 allows chemical use to be minimized in this manner, while still leaving an opening in tank 12 that is large enough to permit wafers to pass through.

Turning again to FIG. 8, fluids pass from folds 40 into the tank as indicated by arrows A1, then inwardly and upwardly over the wafer surface as indicated by small arrows A2. As fluids reach the top of the tank, they flow through channels 70, 72, 74 and 76, then through channel 62 in lid 14 or channels 63 along the tops of the displacers (see FIG. 3), and finally over interior wall 32 into overflow weir 34 (not shown). See arrow A3. Flow of fluids into and through the tank continues for a period of time as required by the particular process being carried out.

Once processing is completed, lid 14 is lifted from tank 12, carrying cassette 54 and the wafers with it. Lid 14 may then be lowered onto a second tank for further processing of the wafers using a different fluid in the second tank. If it is desired to seal the tank 12 from the surrounding environment when it is not in use, a secondary lid (not shown) may be lowered onto the tank 12 after the lid 14 is removed.

Displaced Fluid Control

As discussed, the vessel 10 is designed to have as little extra volume as possible so as to reduce overall chemical usage. Because of this, the vessel lacks extra space for accommodating the volume of fluid that will be displaced when the wafers are lowered into a filled vessel. If the wafers are lowered into the tank after the tank has been filled with fluids, there is the potential that displaced fluids will rush over interior wall 32 and into overflow weir 34. This effect may be worsened by rapid insertion of the wafers into the tank, which is a practice desirable for minimizing the wafer's exposure to the air.

When interior wall 32 is sized to position the overflow level higher than the wafers' top edges, it may restrict the flow of the displaced fluid, forcing the fluids to seek alternate paths out of the tank and resulting in fluid spillage over walls 20 and 24. An overflow wall 32 having a height below the top edges of the wafers may be effectively used to provide a larger flow path for the displaced volume to flow into the overflow weir. However, as discussed above this solution may not be desirable for vessels that must maintain a full fluid level (as in the rinse tank example given above) and for those in which the potential for crust formation is significant, since the crust level is preferably kept above the overflow level.

A low overflow level may additionally raise cost concerns in singlepass systems, since fluid spilling over the wall 32 into the overflow weir is disposed of not—recirculated back into the system. Any fluid cascading into the overflow weir during product insertion is thus simply wasted. One aspect of the vessel 10 provides alternate solutions for preventing the spilling and/or wasting of chemical during product insertion into the tank. Two such solutions will next be described with reference to fourth and fifth embodiments.

Figure 9:
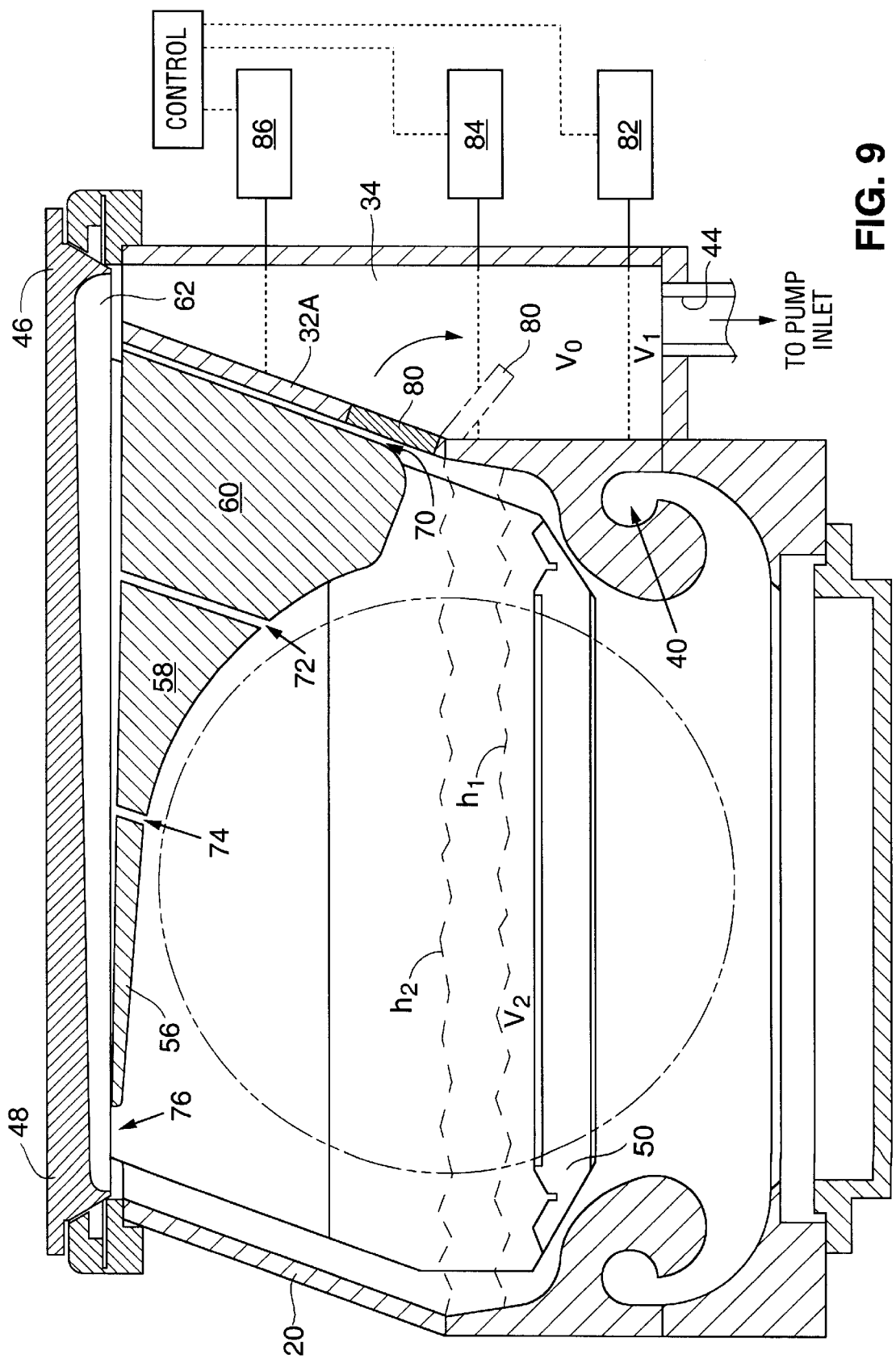
FIG. 9 is a cross-sectional front elevation view similar to FIG. 3, showing a fourth embodiment utilizing a gated interior wall.

Referring to FIG. 9 a fourth embodiment operates to control fluid displacement by bleeding a volume of fluid from the vessel into the weir before the wafers are immersed in the vessel. It is particularly useful for recirculating processes, in which fluids in overflow weir 34 are pumped back into the system via inlets 42, since fluids released into the weir are recirculated back into the vessel and thus will not be wasted.

Referring to FIG. 9, gate 80 is formed into the interior wall 32a. Gate 80 includes one end forming a hinged connection to wall 32a and a second, free, end. The free end is pivotable about the hinged end to an opened position illustrated in dashed lines in FIG. 9. It should be noted that the gate and associated features described with respect to the fourth embodiment may be utilized on vessels having any number of shapes arid are not limited for use on the vessel shown.

The position of gate 80 and the size of weir 34 are selected such that, when the vessel is full of fluid, the act of opening gate 80 will cause a volume of fluid $V_0$ to flow out of the vessel into weir 34. Volume $V_0$ is selected to be approximately equivalent to the amount of fluid that would have been displaced by the wafers, cassette and fluid displacers had they been immersed into a full vessel of fluid. Decreasing the volume in the vessel by the amount $V_0$ leaves a remaining volume $V_2$ within the vessel, which will completely fill the vessel after the wafers, cassette and displacers are situated within it. Weir 34 must be sufficiently large to accommodate volume $V_0$ plus a minimal volume $V_1$ that must remain in the weir at all times so as to maintain suction of the recirculation pump.

Fluid level sensors 82, 84, 86 are positioned to detect when fluid in the weir has reached predetermined levels. When sensor 82 detects that the liquid level in the weir has fallen below the minimum level, it triggers an event (e.g. an increase of flow into the vessel or a decrease in flow out of the vessel) that will bring the liquid level back to a safer level. Sensor 84 detects a fluid level representing a fluid volume of $V_0+V_1$. Its output is used to signal when gate 80 may be closed at end of a bleed down step. Sensor 86 detects when the level in weir 34 reaches an upper level, and is selected to safeguard against overflow of weir 34. When a fluid level is detected by sensor 86, appropriate steps are taken (e.g. reduction in flow into the vessel or increase in flow out of the vessel) to bring the level to a safer condition.

Use of the embodiment of FIG. 9 involves the procedures described with respect to the first embodiment, together with the following modifications.

As described above, the process begins with the vessel in a full state. Gate 80 is opened just prior to immersion of the wafers and cassette into the vessel. Fluid drains through the opened gate into weir 34. Sensor 84 detects when the volume in the weir has reached $V_0+V_1$, and its feedback results in the closing of gate 80.

Lid 14 is then lowered onto the tank as described above. The cassette, wafers, and displacers move into the vessel, displacing the fluid in the vessel and causing the fluid to rise to the top of the vessel. Pump (is not shown) is then activated, causing fluids to flow from weir 34, through inlets 42 back into the vessel and to be continuously recirculated for the duration of the process.

A fifth embodiment includes features useful for controlling displaced fluid volume in single pass processes, i.e. in processes in which fluid overflowing into the overflow weir is disposed of rather than recirculated through the system. The fifth embodiment differs from the fourth in that it is geared towards avoiding flow of displaced fluid into the weir 34, since all fluid flowing into weir 34 is disposed of and would thus be wasted in a single pass system.

Figure 10:
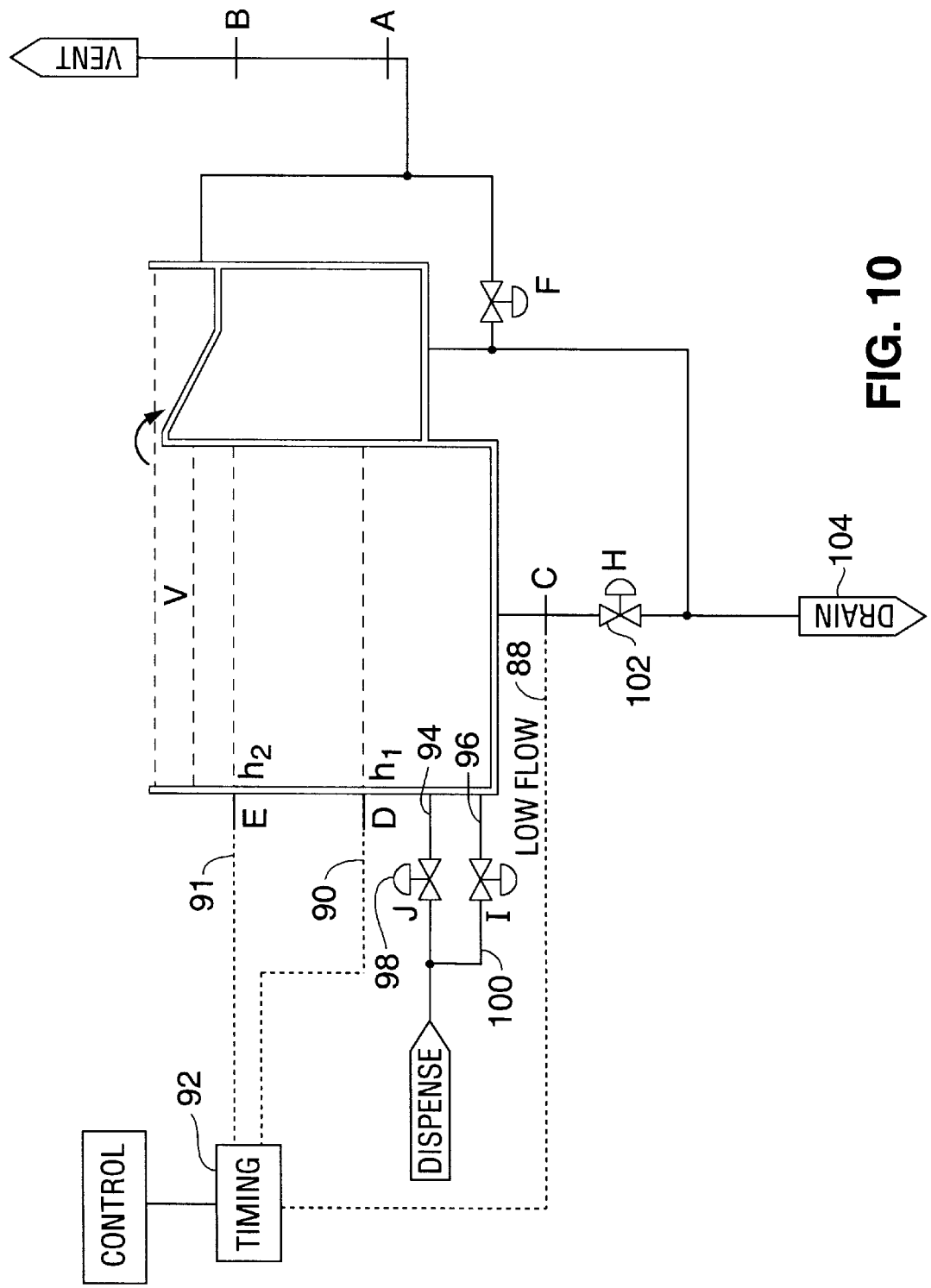
FIG. 10 is a schematic representation of a vessel and system utilizing a fluid displacement control method in accordance with a fifth embodiment.

A fill system for the fifth embodiment is schematically illustrated in FIG. 10. This fill system may be used for vessels having the shapes shown in the FIGS. 1–7D or in any other system in which control of fluid displacement is needed. The fifth embodiment avoids chemical loss resulting from fluid displacement by filling the vessel with a fill volume $V_2$ which, when combined with the volume that will be occupied by the cassette, wafers, and displacers, result in a full tank. The fifth embodiment may operate in various modes. One mode is a static mode, in which all of $V_2$ is dispensed into the tank prior to insertion of the wafers and cassette. A second mode is a dynamic mode in which a portion of the volume is dispensed into the vessel before insertion of the wafers and cassette, and in which the remaining portion is dispensed as the wafers and cassette are being lowered into the vessel.

The fifth embodiment relies on a plurality of fluid level sensors 88, 90. Sensor 88 positioned at the bottom of the vessel (such as at a drain outlet) detects initial accumulation of fluid in the tank. Sensor 91 is positioned to detect when the fluid level in the tank has reached a height $h_1$ corresponding to a fluid volume V1. Sensor 91 detects when the fluid has reached a height h2 corresponding to fluid volume V2. Sensors 88, 90 and 91 are coupled to a timing system 92.

The plumbing that carries fluid into the vessel (such as through inlets 42 (FIG. 1)) includes a pair of branches 94, 96. Valves 98, 100 govern flow through the branches 94, 96 and allow for rapid dispensing (both valves opened) or low flow dispensing (valve 98 opened and valve 100 closed) into the vessel.

Operation of the fifth embodiment in a static mode is as follows. Operation begins with the vessel empty of fluids and containing no wafers. Valves 98, 100 are opened to begin the flow of processing fluids into the vessel. Sensor 88 detects the flow of fluid into the vessel and results in the activation of timing system 92 to measure the time it takes for the fluid level in the tank to rise to level h1. When sensor 90 detects the fluid at height h1 timing system 92 registers the time taken to reach h1 and continues timing as the fluid level in the tank rises to level h2. The time taken for the fluid to rise from h1 to h2 is likewise registered. The flow rate of fluid entering the tank is calculated by the system controller using the measured times and the known volumes V1 and V2. From the calculated flow rate, the fill time (i.e. the time it will take to fill the vessel to maximum volume, where maximum volume is the full volume of the tank minus the amount of displacement that will occur) is calculated. It should be noted that, because variations in the fluid flow rates into the system can be significant, it is desirable to calculate the fill time based on at least the two measured times as described so as to increase the accuracy of the fill.

Flow of fluid via inlets 42 continues for the calculated fill time. Once filling has been carried out for the fill time, lid 14 is lowered onto the tank as described above, moving the cassette, wafers, and displacers into the vessel. Immersion of the cassette, wafers and displacers into the vessel displaces the fluid in the vessel, causing the fluid to rise to the top of the vessel.

Valve 98 is next closed, resulting in a slower flow of fluid into the vessel. Chemical continues to be dispensed into the vessel at the slower rate for the duration of processing, overflowing into weir 34, then through outlet 44 in weir 34, and to drain 104 for disposal. Once processing is completed, the wafers are lifted out of the vessel, valve 102 is opened and the vessel is emptied of fluids through drain 104.

Operation of the vessel in dynamic mode differs from its operation in static mode in that the cassette and wafers are lowered into the tank as the tank is filled with fluid. Preferably, the process of lowering the wafers and cassette into the tank begins once the liquid level in the tank has reached height h1. The fill time is calculated based on the time taken to fill the vessel to height h1 and the known volume V1 corresponding to h1. As the wafers/cassette are lowered into the tank, flow of fluid via inlets 42 continues for the calculated fill time. At the end of the fill time, valve 98 is closed, resulting in a slower flow of fluid into the vessel. As in the static mode, chemical continues to be dispensed into the vessel at the slower rate for the duration of processing, overflowing into weir 34, then through outlet 44 in weir 34, and to drain 104 for disposal.

Concepts of the fourth and fifth embodiments may be combined during operation to operate the system such that there is an overflow condition both at the gate 80 (FIG. 9) and over the top of the overflow wall 32*a* during filling of the tank and product insertion. In some systems, particles can accumulate at the fluid surface where they may transfer onto wafers passing into the fluid. This mode of operation is desirable in that it sheds any such particles from the fluid surface before the wafers pass through the surface.

Use of this combined operation may be described schematically with respect to FIG. 9. The process begins with the vessel empty and the gate 80 opened. The vessel is filled to a level h1 selected to be below the gate 80. The flow rate into the tank, as well as the fill time that it will take to bring the fluid level to a second level h2 is calculated as described above. Level h2 is selected to be at the approximate height of the gate 80. Naturally, fluid sensors are positioned to detect liquid levels at h1 and h2.

Once the fluid level reaches h2, movement of the wafers into the tank is initiated while the fluid continues to rise in the tank. Eventually, the fluid reaches level h2 and begins to cascade through gate 80 in overflow weir. Once the wafers reach level h2, gate 80 is closed, thus allowing the fluid to rise further in the tank and to overflow at the top of overflow wall 32*a*.

An objective of this combined mode of operation is to create a situation in which a small volume of fluid leaves the tank through gate 80 before wafers being lowered into the tank strike the fluid surface. By doing so, particles on the fluid surface are shed from the surface and into the overflow weir rather than remaining on the fluid surface where they may come into contact with the wafers. The system is timed such that the time needed for the fluid level to reach h2 and for a volume of that fluid (calculated to shed particles from the fluid surface) to flow through gate 80 is approximately equal to the time taken for the system robotics to bring the lower edges of the wafers to level h2.

While the subject invention has been described with reference to preferred embodiments, various changes and modifications could be made therein, by one skilled in the art, without varying from the scope and spirit of the subject invention as defined by the appended claims.

We claim:

1. A method of delivering fluid into a process vessel for treatment of planar objects within the process vessel, comprising the steps of:

providing a process vessel having a plurality of side walls and a bottom wall, a first fluid inlet coupled to the process vessel, and a first tubular region having a first curved surface and positioned within the process vessel;

positioning a planar object within the process vessel;

directing fluid to the first curved surface of the first tubular region of the process vessel via the first fluid inlet; and causing the fluid to flow in a flow path in which it curls laterally outwardly from the first curved surface of the first tubular region, downwardly towards the bottom wall, then upwardly over a surface of said planar object positioned within the process vessel.

2. The method of claim 1 wherein the first fluid inlet extends axially into the process vessel.

3. The method of claim 1 wherein the providing step further includes a second fluid inlet coupled to the process vessel and a second tubular region having a second curved surface and positioned within the process vessel, and wherein the method further comprises the steps of:

directing fluid to the second curved surface of the second tubular region of the process vessel via the second fluid inlet; and causing fluid to flow in a flow path in which it curls laterally outwardly from the second curved surface of the second tubular region, downwardly towards the bottom wall, then upwardly over the surface of the planar object positioned within the process vessel.

4. The method of claim 1 wherein the process vessel further comprises a first curled manifold, and wherein the first curved surface forms a portion of the first curled manifold, and wherein the causing step causes the fluid to flow through the first curled manifold.

5. The method of claim 1 wherein the process vessel further comprises a contoured wall section adjacent to the first tubular region and wherein the first curved surface forms a portion of the contoured wall section.

6. The method of claim 1 wherein the first tubular region further comprises an elongate tubular member having at least one side opening and wherein the causing step causes the fluid to flow through the side opening to the first curved surface.

7. The method of claim 3 wherein the first and second tubular regions are substantially parallel to one another.

8. The method of claim 3 wherein the flow paths extending from the first and second tubular regions are approximate mirror images of one another.

9. The method of claim 3 wherein the process vessel further comprises a second curled manifold formed in the process vessel, and wherein the second curved surface forms a portion of the second curled manifold, and wherein the causing step causes the fluid to flow through the second curled manifold.

10. The method of claim 3 wherein the process vessel further comprises a first contoured wall section adjacent to the first tubular region and a second contoured wall section adjacent to the second tubular region, and wherein the first and second curved surfaces form portions of the first and second contoured wall sections.

* * * * *